US009484252B2

(12) United States Patent
Chae et al.

(10) Patent No.: US 9,484,252 B2
(45) Date of Patent: Nov. 1, 2016

(54) INTEGRATED CIRCUITS INCLUDING SELECTIVELY DEPOSITED METAL CAPPING LAYERS ON COPPER LINES AND METHODS FOR FABRICATING THE SAME

(71) Applicant: GLOBAL FOUNDRIES, Inc., Grand Cayman (KY)

(72) Inventors: Moosung Chae, Englewood Cliffs, NJ (US); Larry Zhao, Niskayuna, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 192 days.

(21) Appl. No.: 14/150,428

(22) Filed: Jan. 8, 2014

(65) Prior Publication Data

US 2015/0194344 A1    Jul. 9, 2015

(51) Int. Cl.
*H01L 21/44* (2006.01)
*H01L 21/768* (2006.01)
*H01L 23/532* (2006.01)
*H01L 23/528* (2006.01)
*H01L 21/3213* (2006.01)

(52) U.S. Cl.
CPC ... *H01L 21/76852* (2013.01); *H01L 21/76885* (2013.01); *H01L 23/53238* (2013.01); *H01L 21/32136* (2013.01); *H01L 21/32139* (2013.01); *H01L 23/5283* (2013.01); *H01L 2924/0002* (2013.01)

(58) Field of Classification Search
CPC .............. H01L 23/53238; H01L 21/28562; H01L 21/7684
USPC .............. 438/627, 622, 626, 643, 653, 687
See application file for complete search history.

(56) References Cited

U.S. PATENT DOCUMENTS

| | | | | |
|---|---|---|---|---|
| 6,709,874 B2* | 3/2004 | Ning | ................ | H01L 21/7684 257/E21.583 |
| 7,834,458 B2* | 11/2010 | Chang | ............ | H01L 21/28556 257/754 |
| 2014/0065815 A1* | 3/2014 | Tanwar | ............ | H01L 21/76832 438/627 |
| 2014/0124900 A1* | 5/2014 | West | .................. | H01L 21/304 257/621 |
| 2015/0021779 A1* | 1/2015 | Liou | ................ | H01L 21/76883 257/773 |
| 2015/0357236 A1* | 12/2015 | Edelstein | ........ | H01L 21/76846 257/751 |

* cited by examiner

*Primary Examiner* — S. V. Clark
(74) *Attorney, Agent, or Firm* — Lorenz & Kopf, LLP

(57) ABSTRACT

Integrated circuits and methods for fabricating integrated circuits are provided. In one example, a method for fabricating an integrated circuit includes selectively depositing a metal capping layer on first sidewalls of a copper line while leaving exposed portions of a dielectric layer that are laterally adjacent to the copper line exposed. An ILD layer is deposited overlying the metal capping layer and the exposed portions of the dielectric layer.

19 Claims, 4 Drawing Sheets

INTEGRATED CIRCUITS INCLUDING SELECTIVELY DEPOSITED METAL CAPPING LAYERS ON COPPER LINES AND METHODS FOR FABRICATING THE SAME

TECHNICAL FIELD

The technical field relates generally to integrated circuits and methods for fabricating integrated circuits, and more particularly relates to integrated circuits including selectively deposited metal capping layers on copper lines and methods for fabricating such integrated circuits.

BACKGROUND

Integrated circuits (ICs) typically include a plurality of semiconductor devices and interconnect wiring. Networks of metal interconnect wiring are often used to connect the semiconductor devices from a semiconductor substrate. Multiple levels of metal interconnect wiring above the semiconductor portion of the substrate are connected together to form a back-end-of-the-line ("BEOL") interconnect structure. Within such a structure, metal lines run parallel to the semiconductor substrate and conductive vias run perpendicular to the semiconductor substrate. The conductive vias typically interconnect the different levels of the metal wiring levels.

Two developments in the last decade have contributed to increased performance of contemporary ICs. One such development is the use of copper as the interconnect metal of the BEOL interconnect structure. Copper is advantageous because it has a higher conductivity compared with the other traditionally used interconnect metals, such as, for example, aluminum (Al). A second development is the employment within the BEOL interconnect structure of a low dielectric constant (low k) dielectric material as the interlayer dielectric (ILD) layer or layers. By "low k," it is meant that the dielectric constant of a particular dielectric material is less than that of silicon dioxide ($SiO_2$). When copper is used as the metal in the interconnect wiring layers, a barrier layer is typically required between the copper lines and the ILD layer to prevent copper from diffusing into the ILD material and damaging the electrical properties of the ILD layer.

One recently developed approach for fabricating copper interconnections involves forming copper lines by subtractively patterning a copper layer that overlies a dielectric layer on a substrate using an etching process. Portions of the dielectric layer that are laterally adjacent to the copper lines become exposed during the subtractive etching of the copper layer. A tantalum nitride (TaN) barrier layer is then uniformly deposited overlying the copper lines and the exposed portions of the dielectric layer. To eliminate electrical shorting between the copper lines, portions of the TaN barrier layer disposed between the copper lines are removed using a reaction ion etching (RIE) process. An ILD layer is then deposited overlying the copper lines and adjacent portions of the dielectric layer. Unfortunately, the RIE etching process is relatively aggressive and can also partially remove and/or damage portions of the TaN barrier layer that overlie the copper lines including, in particular, along the sidewalls of the copper lines. As such, these remaining portions of the TaN barrier layer may be too thin or damaged to prevent copper from the copper lines from diffusing into the ILD layer.

Accordingly, it is desirable to provide integrated circuits including copper lines and diffusion barriers that inhibit copper from the copper lines from diffusing into an ILD layer and methods for fabricating such integrated circuits. Furthermore, other desirable features and characteristics of the present invention will become apparent from the subsequent detailed description and the appended claims, taken in conjunction with the accompanying drawings and this background.

BRIEF SUMMARY

Integrated circuits and methods for fabricating integrated circuits are provided herein. In accordance with an exemplary embodiment, a method for fabricating an integrated circuit includes selectively depositing a metal capping layer on first sidewalls of a copper line while leaving exposed portions of a dielectric layer that are laterally adjacent to the copper line exposed. An ILD layer is deposited overlying the metal capping layer and the exposed portions of the dielectric layer.

In accordance with another exemplary embodiment, a method for fabricating an integrated circuit is provided. The method includes patterning a hard mask layer that overlies a copper layer to form a cap. The copper layer overlies a liner layer and is etched using the cap as a first etch mask to form a copper line that has sidewalls. The liner layer overlies a dielectric layer and is etched using the cap and the copper line as a second etch mask to form a liner that overlies a first portion of the dielectric layer. Etching the liner layer exposes second portions of the dielectric layer that are disposed laterally adjacent to the copper line. The cap, the copper line, and the second portions of the dielectric layer are exposed to a metal precursor gas to selectively form a metal capping layer overlying the sidewalls of the copper line while leaving the second portions of the dielectric layer exposed. The metal precursor gas includes Co, Ru, W, Mn, or a combination thereof. An ILD layer is deposited overlying the metal capping layer and the second portions of the dielectric layer.

In accordance with another exemplary embodiment, an integrated circuit is provided. The integrated circuit includes a silicon-containing substrate. A dielectric layer overlies the silicon-containing substrate. A liner overlies a first portion of the dielectric layer. A copper line has sidewalls and overlies the liner. A metal capping layer overlies the sidewalls of the copper line. The metal capping layer includes Co, Ru, W, Mn, or a combination thereof. An ILD layer overlies the metal capping layer and second portions of the dielectric layer that are disposed laterally adjacent to the copper line.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following Detailed Description is merely exemplary in nature and is not intended to limit the various embodiments or the application and uses thereof. Furthermore, there is no intention to be bound by any theory presented in the preceding background or the following detailed description.

Various embodiments contemplated herein relate to integrated circuits and methods for fabricating integrated circuits. During intermediate stages of the fabrication of an integrated circuit (IC), a copper layer that overlies a dielectric layer on a silicon-containing substrate is subtractively patterned to form a copper line that has sidewalls. As used herein, the term "overlying" is understood to mean "on" or "over." Portions of the dielectric layer that are laterally adjacent to the copper line become exposed during patterning of the copper layer. A metal capping layer is selectively deposited onto the sidewalls of the copper line while leaving the exposed portions of the dielectric layer exposed. In an exemplary embodiment, the metal capping layer includes cobalt (Co), ruthenium (Ru), tungsten (W), and/or manganese (Mn) and acts as a diffusion barrier that inhibits or prevents copper from diffusing through the metal capping layer. An ILD layer is deposited overlying the metal capping layer and the exposed portions of the dielectric layer. Because the metal capping layer is selectively deposited onto the copper line while leaving the exposed portions of the dielectric layer exposed, a RIE etching process or other like etching process is not needed to remove diffusion barrier material from these portions of the dielectric layer to prevent electrical shorting. As such, thinning or damage to the metal capping layer otherwise caused from exposure to a RIE etching process is avoided to provide an improved diffusion barrier to inhibit copper from the copper line from diffusing into the ILD layer.

FIGS. 1-7 illustrate methods for fabricating an integrated circuit 10 in accordance with various embodiments. The described process steps, procedures, and materials are to be considered only as exemplary embodiments designed to illustrate to one of ordinary skill in the art methods for practicing the invention; the invention is not limited to these exemplary embodiments. Various steps in the manufacture of integrated circuits are well known and so, in the interest of brevity, many conventional steps will only be mentioned briefly herein or will be omitted entirely without providing the well-known process details.

Figure 1:
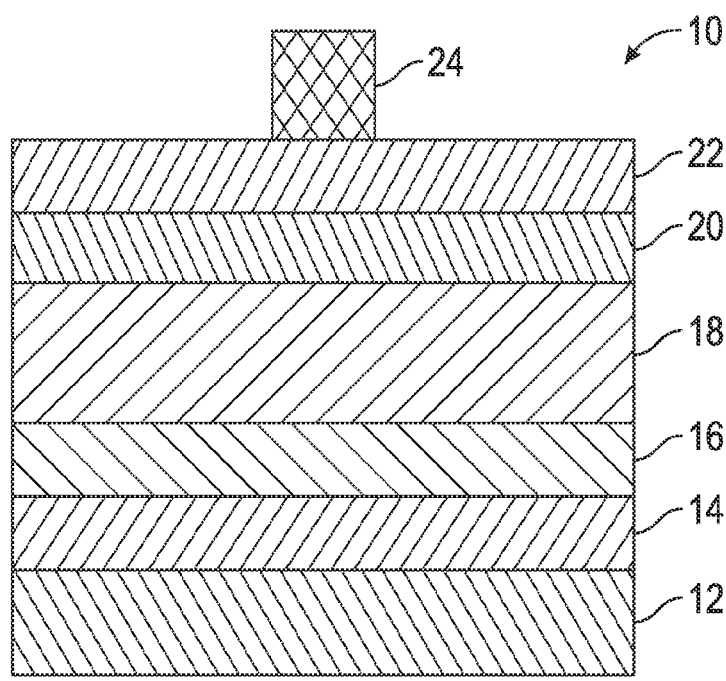
FIG. 1 illustrates, in cross-sectional view, an integrated circuit during an intermediate fabrication stage in accordance with an exemplary embodiment.

FIG. 1 illustrates, in cross-sectional view, a portion of the integrated circuit 10 during an intermediate fabrication stage in accordance with an exemplary embodiment. The integrated circuit 10 includes a substrate 12, which can be either a bulk silicon wafer or a thin silicon layer on an insulating substrate (SOI). As used herein, the terms "silicon layer" and "silicon substrate" are used to encompass the relatively pure or lightly impurity-doped monocrystalline silicon materials typically used in the semiconductor industry as well as silicon admixed with other elements such as germanium, carbon, and the like to form a substantially monocrystalline semiconductor material. The substrate 12 can contain, for example, various electronic devices including a plurality of interconnected field effect transistors (FETs) or MOS transistors in the form of CMOS, NMOS, and/or PMOS elements.

As illustrated, overlying the substrate 12 are a dielectric layer 14, a liner layer 16, a copper layer 18, a hard mask layer 20, a hard mask layer 22, and a patterned photoresist layer 24, respectively. In an exemplary embodiment, the dielectric layer 14 includes $SiO_2$ and has a thickness of from about 500 Å to about 3 µm; the liner layer 16 includes tantalum (Ta), tantalum nitride (TaN), titanium (Ti), and/or titanium nitride (TiN) and has a thickness of from about 10 to about 1000 Å; the copper layer 18 has a thickness of from about 100 Å to about 3 µm; the hard mask layer 20 includes Ta (e.g., Ta hard mask layer) or other material suitable as a copper diffusion barrier (discussed in further detail below) and has a thickness of from about 10 to about 1000 Å; and the hard mask layer 22 includes $SiO_2$.

The dielectric layer 14 and the liner layer 16 are formed utilizing well-known deposition techniques, such as chemical vapor deposition (CVD) or the like. After forming the liner layer 16, physical vapor deposition (PVD), CVD, electroplating, or the like are used to form the copper layer 18. The hard mask layers 20 and 22 are then deposited utilizing well-known deposition techniques, such as CVD or the like. After forming the hard mask layers 20 and 22, a photoresist material is deposited and patterned as is known to those skilled in the art to form the patterned photoresist layer 24.

Figure 2:
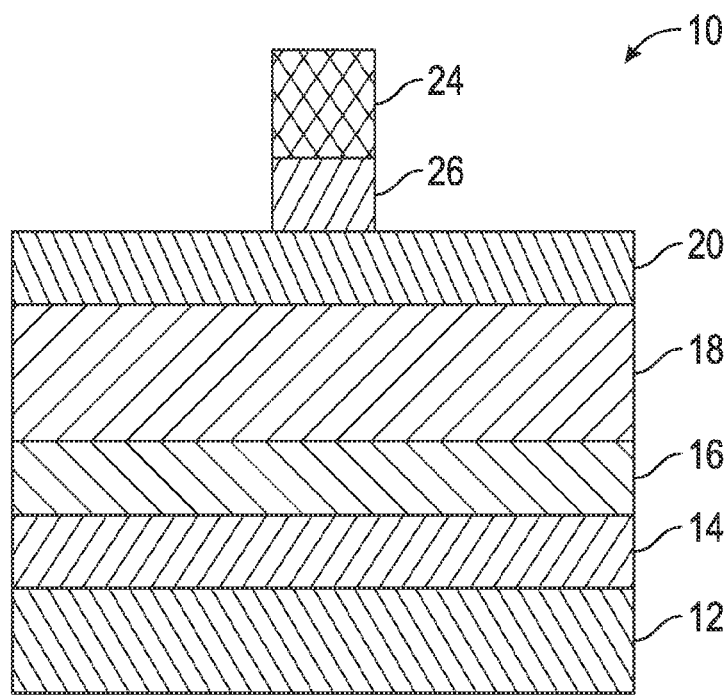
FIG. 2 illustrates, in cross-sectional view, an integrated circuit during a further advanced fabrication stage in accordance with an exemplary embodiment.

The process continues as illustrated in FIG. 2 by patterning the hard mask layer 22 to form a patterned hard mask layer 26. The patterned hard mask layer 26 may be formed using either a dry etching process, such as RIE or the like, or a wet etching process suitable for etching $SiO_2$, for example. The patterned photoresist layer 24 is then removed as illustrated in FIG. 3 using well-known techniques.

Figure 3:
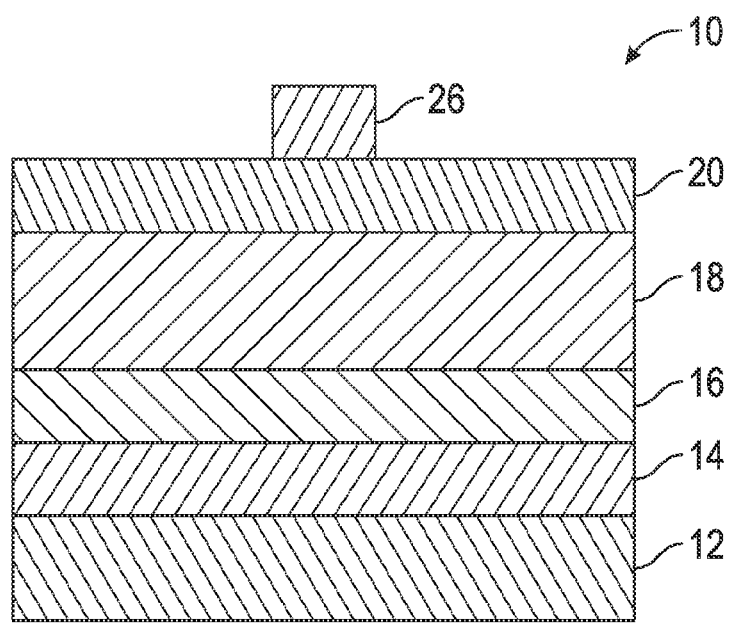
FIG. 3 illustrates, in cross-sectional view, an integrated circuit during a further advanced fabrication stage in accordance with an exemplary embodiment.
Figure 4:
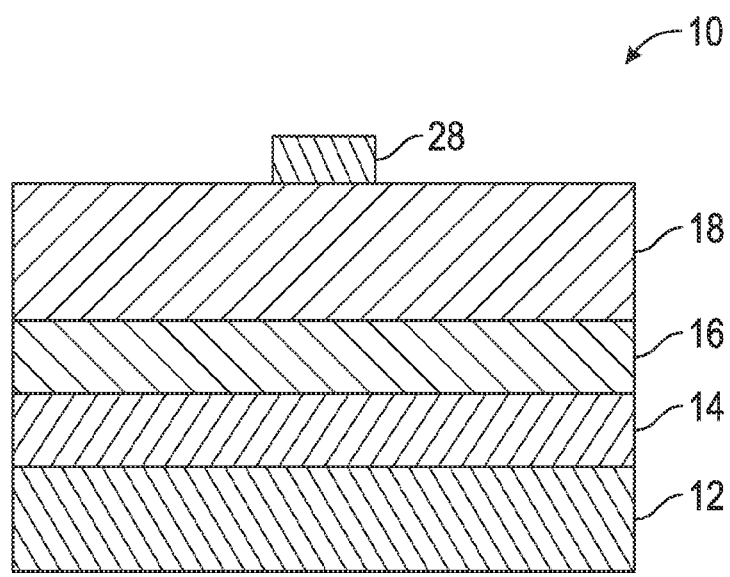
FIG. 4 illustrates, in cross-sectional view, an integrated circuit during a further advanced fabrication stage in accordance with an exemplary embodiment.

Referring to FIGS. 3-4, using the patterned hard mask layer 26 as an etch mask, the hard mask layer 20 is etched to pattern the hard mask layer 20 forming a cap 28. In an exemplary embodiment and as discussed above, the cap 28 is formed of a material such as Ta that functions as a copper diffusion barrier.

Figure 5:
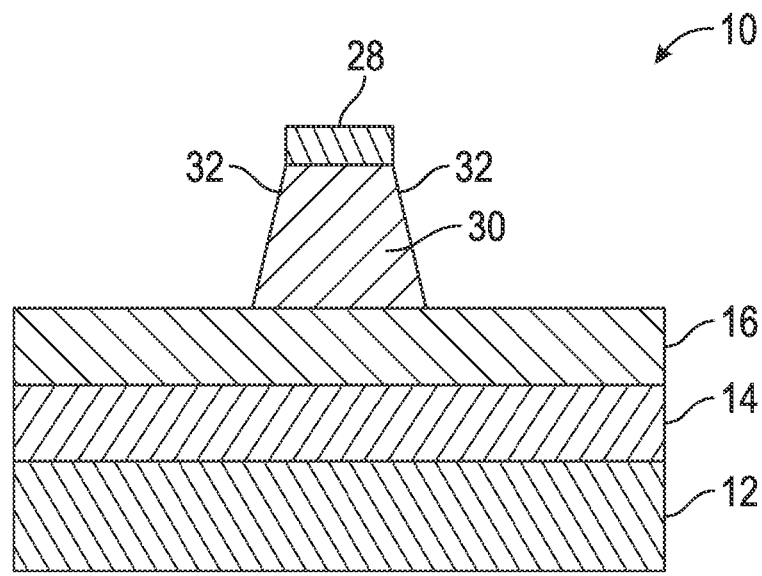
FIG. 5 illustrates, in cross-sectional view, an integrated circuit during a further advanced fabrication stage in accordance with an exemplary embodiment.

FIG. 5 illustrates the IC 10 during a further advanced fabrication stage in accordance with an exemplary embodiment. Using the cap 28 as an etch mask, the copper layer 18 is subtractively patterned via an etching process to form a copper line 30. The copper layer 18 may be etched using a dry etching process or alternatively, using a wet etching process. In an exemplary embodiment, the copper layer 18 is etched using a methanol-based plasma etching process. Other etching processes known to those skilled in the art may also be used. As illustrated, the copper line 30 has exposed sidewalls 32 extending from the liner layer 16 to the cap 28.

Figure 6:
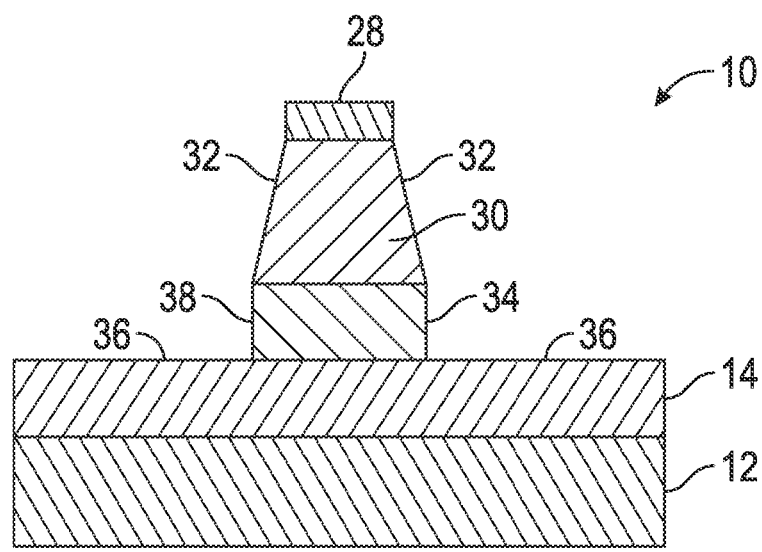
FIG. 6 illustrates, in cross-sectional view, an integrated circuit during a further advanced fabrication stage in accordance with an exemplary embodiment.

The process continues as illustrated in FIG. 6 by etching the liner layer 16 using the cap 28 and the copper line 30 as an etch mask to form a liner 34. In an exemplary embodiment, the liner layer 16 is etched using a dry etching process such as a fluorine-based plasma etching process. Other etching processes for etching Ta, TaN, Ti, or TiN known to those skilled in the art may also be used. As illustrated, etching the liner layer 16 exposes portions 36 of the underlying dielectric layer 14 that are laterally adjacent to the copper line 30 while a portion 38 of the dielectric layer 14 directly under the liner 34 is covered by the stack formed by the liner 34, the copper line 30, and the cap 28.

Figure 7:
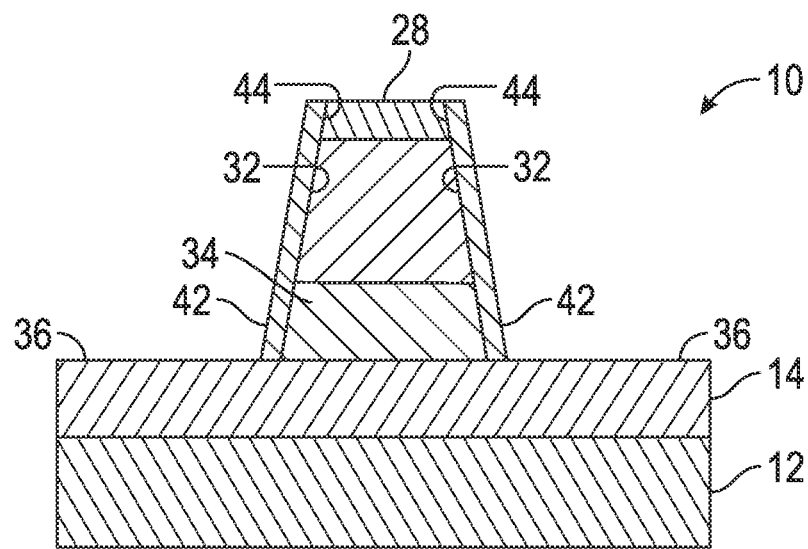
FIG. 7 illustrates, in cross-sectional view, an integrated circuit during a further advanced fabrication stage in accordance with an exemplary embodiment.

FIG. 7 illustrates the IC 10 during a further advanced fabrication stage in accordance with an exemplary embodiment. A metal capping layer 40 is selectively deposited on the sidewalls 32 of the copper line 30 while leaving the portions 36 of the dielectric layer 14 exposed. As illustrated, the metal capping layer 40 extends from the dielectric layer 14 along the sidewalls 42 of the liner 34 to the sidewalls 44 of the cap 28. The metal capping layer is formed of a metal that acts as a copper diffusion barrier and includes, for example, Co, Ru, W, and/or Mn. In an exemplary embodiment, the metal capping layer 40 has a thickness of from about 5 to about 30 Å, such as from about 15 to about 25 Å, for example about 20 Å.

In an exemplary embodiment, the metal capping layer 40 is formed by exposing the cap 28, the copper line 30, and the portions 36 of the dielectric layer 14 to a selective deposition process that includes a metal precursor gas. The metal precursor gas includes Co, Ru, W, and/or Mn. In one example, the metal precursor gas is a cobalt precursor gas for forming a cobalt-containing material (e.g., a metallic cobalt or cobalt alloy capping layer). Non-limiting examples of cobalt precursor gases include cobalt carbonyl complexes, cobalt amidinates compounds, cobalt nitrosyl complexes, derivatives thereof, complexes thereof, plasma thereof, or combinations thereof.

In an exemplary embodiment, the metal capping layer 40 is selectively deposited by thermal decomposition of the metal precursor gas. In one embodiment, the IC 10 is heated in a process chamber and exposed to the metallic precursor gas at a temperature of from about 50 to about 600° C., such as from about 100 to about 500° C., for example from about 200 to about 400° C. for selective deposition of the metal capping layer 40. Alternatively, the metal capping layer is selectively deposited by exposing the IC 10 to the metal precursor gas using a CVD or atomic layer deposition (ALD) process.

Figure 8:
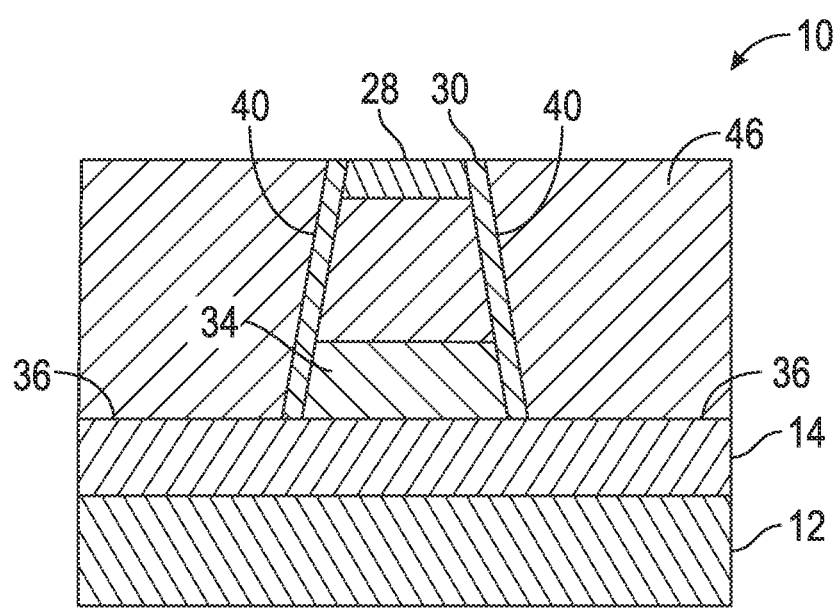
FIG. 8 illustrates, in cross-sectional view, an integrated circuit during a further advanced fabrication stage in accordance with an exemplary embodiment.

Referring to FIG. 8, an ILD layer 46 is deposited overlying the metal capping layer 40 and the portions 36 of the dielectric layer. The ILD layer 46 may be formed from various dielectric materials preferably having a dielectric constant of about 4 or less, more preferably of about 3.5 or less. The dielectric materials that may be used to form the ILD layer 46 include inorganic dielectrics or organic dielectrics that are porous, nonporous or contain regions and/or surfaces that are porous and other regions and/or surfaces that are nonporous. Some non-limiting examples of ILD dielectric materials are silsesquioxanes, organosilicates that include atoms of Si, C, O, and H, polymeric materials such as thermosetting polyarylene ethers, or multilayers thereof. The thickness of the ILD layer 46 may vary depending upon the dielectric material used. Typically, the ILD layer 46 has a thickness from about 50 to about 2000 nm.

The ILD layer 46 is formed by utilizing any conventional process, such as, for example, a deposition process including plasma enhanced chemical vapor deposition (PECVD), CVD, evaporation, and chemical solution deposition. After forming the ILD layer 46, the uppermost surfaces of the cap 28 and the ILD layer 46 are made coplanar by being polished and cleaned by a CMP process.

Accordingly, integrated circuits including selectively deposited metal capping layers on copper lines and methods for fabricating such integrated circuits have been described. In an exemplary embodiment, during intermediate stages of fabrication of an integrated circuit (IC), a metal capping layer is selectively deposited on sidewalls of a copper line while leaving exposed portions of a dielectric layer that are laterally adjacent to the copper line exposed. An ILD layer is deposited overlying the metal capping layer and the exposed portions of the dielectric layer.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. A method for fabricating an integrated circuit comprising:
   selectively depositing a metal capping layer on first sidewalls of a copper line while leaving exposed portions of a dielectric layer that are laterally adjacent to the copper line exposed, wherein the copper line is disposed over the dielectric layer and wherein the first sidewalls extend transverse to a surface of the dielectric layer; and
   depositing an ILD layer overlying the metal capping layer and the exposed portions of the dielectric layer.

2. The method of claim 1, wherein selectively depositing comprises selectively depositing the metal capping layer that comprises Co, Ru, W, Mn, or a combination thereof.

3. The method of claim 1, wherein selectively depositing comprises selectively depositing a cobalt capping layer as the metal capping layer.

4. The method of claim 1, wherein selectively depositing comprises forming the metal capping layer having a thickness of from about 5 to about 30 Å.

5. The method of claim 1, wherein selectively depositing comprises forming the metal capping layer having a thickness of from about 15 to about 25 Å.

6. The method of claim 1, wherein depositing comprises depositing the ILD layer overlying the dielectric layer that comprises $SiO_2$.

7. The method of claim 1, wherein a cap having second sidewalls overlies the copper line, and wherein selectively depositing comprises selectively depositing the metal capping layer on the second sidewalls of the cap.

8. A method for fabricating an integrated circuit comprising:
   selectively depositing a metal capping layer on first sidewalls of a copper line while leaving exposed portions of a dielectric layer that are laterally adjacent to the copper line exposes, wherein the copper line overlies a liner that has third sidewalls and that overlies a covered portion of the dielectric layer disposed between the exposed portions, and wherein selectively depositing further comprises selectively depositing the metal capping layer on the third sidewalls of the liner; and
   depositing an ILD layer overlying the metal capping layer and the exposed portions of the dielectric layer.

9. A method for fabricating an integrated circuit comprising:

patterning a hard mask layer that overlies a copper layer to form a cap;

etching the copper layer that overlies a liner layer using the cap as a first etch mask to form a copper line that has sidewalls;

etching the liner layer that overlies a dielectric layer using the cap and the copper line as a second etch mask to form a liner that overlies a first portion of the dielectric layer, wherein etching the liner layer exposes second portions of the dielectric layer that are disposed laterally adjacent to the copper line;

exposing the cap, the copper line, and the second portions of the dielectric layer to a metal precursor gas to selectively form a metal capping layer overlying the sidewalls of the copper line while leaving the second portions of the dielectric layer exposed, wherein the metal precursor gas comprises Co, Ru, W, Mn, or a combination thereof; and depositing an ILD layer overlying the metal capping layer and the second portions of the dielectric layer.

10. The method of claim 9, wherein patterning comprises patterning the hard mask layer that comprises Ta.

11. The method of claim 9, wherein etching the copper layer comprises etching the copper layer using a methanol-based plasma etching process.

12. The method of claim 9, wherein etching the liner layer comprises etching the liner layer that comprises Ta, Ti, TaN, TiN, or combinations thereof.

13. The method of claim 9, wherein exposing comprises exposing the cap, the copper line, and the second portions to the metal precursor gas that comprises Co.

14. The method of claim 9, wherein exposing comprises thermally decomposing the metal precursor gas to selectively deposit the metal capping layer.

15. The method of claim 14, wherein thermally decomposing comprises thermally decomposing the metal precursor gas at a temperature of from about 50 to about 600° C.

16. The method of claim 9, wherein exposing comprises exposing the cap, the copper line, and the second portions to the metal precursor gas in an ALD process.

17. The method of claim 9, wherein exposing comprises exposing the cap, the copper line, and the second portions of the dielectric layer to the metal precursor gas in a CVD process.

18. The method of claim 17, wherein the cap and the liner have corresponding sidewalls, and wherein exposing comprises selectively depositing the metal capping layer on the corresponding sidewalls of the cap and the liner.

19. The method of claim 9, further comprising planarizing the cap and the ILD layer using a CMP process.

* * * * *